US012757357B2

(12) United States Patent
Kuo et al.

(10) Patent No.: US 12,757,357 B2
(45) Date of Patent: Oct. 6, 2026

(54) INTERCHANGEABLE HEATSINK EXPANSION CARD HOLDER MODULE FOR AN INFORMATION HANDLING SYSTEM

(71) Applicant: Dell Products LP, Round Rock, TX (US)

(72) Inventors: Yu-Ming Kuo, New Taipei City (TW); Kang-Wei Fan, ZhongLi Dist (TW); Tung-Yi Chen, Banciao (TW); Jing-Tang Wu, Xizhi District (TW); Shu-Yu Jiang, Shilin Dist. (TW); Chun-Hsiung Wang, Taoyuan City (TW)

(73) Assignee: DELL PRODUCTS LP, Round Rock, TX (US)

( * ) Notice: Subject to any disclaimer, the term of this patent is extended or adjusted under 35 U.S.C. 154(b) by 288 days.

(21) Appl. No.: 18/737,291

(22) Filed: Jun. 7, 2024

(65) Prior Publication Data

US 2025/0380386 A1 Dec. 11, 2025

(51) Int. Cl.
*H05K 7/20* (2006.01)
*G06F 1/20* (2006.01)

(52) U.S. Cl.
CPC ............. *H05K 7/2039* (2013.01); *G06F 1/20* (2013.01)

(58) Field of Classification Search
CPC .... H05K 7/2039; H05K 7/20509; G06F 1/20; G06F 1/185; G06F 1/186
See application file for complete search history.

(56) References Cited

U.S. PATENT DOCUMENTS 4,575,038 A * 3/1986 Moore .................... H05K 7/12 361/717
6,612,498 B1 9/2003 Lipponen
7,240,145 B2 7/2007 Holman
7,355,860 B2 4/2008 Miller
7,364,090 B2 4/2008 Cuellar
7,457,122 B2 * 11/2008 Lai ........................ G11C 5/143 257/E23.103
7,597,268 B2 10/2009 Jones
7,987,308 B2 7/2011 Jo
8,051,253 B2 11/2011 Okin
8,752,765 B2 6/2014 Harari
9,158,546 B1 10/2015 Smith
9,390,035 B2 7/2016 Hinkle
9,558,135 B2 1/2017 Jones
9,626,290 B2 4/2017 Karamcheti
(Continued)

*Primary Examiner* — Jacob R Crum
(74) *Attorney, Agent, or Firm* — Prol Intellectual Property Law, PLLC; H. Kenneth Prol

(57) ABSTRACT

A heatsink expansion card holder module for operative coupling to a motherboard of an information handling system comprising a plastic card holder frame including a frame structure including a plurality of double snap fit hooks extending from a perimeter of the frame structure. A metal heatsink card to snap in to a first layer of the plurality of double snap fit hooks such that the metal heatsink card is held to the plastic card holder frame. The heatsink expansion card holder module sized to fit a first type of expansion card by snapping into a second layer of at least two of the plurality of the double snap fit hooks or to fit a second type of expansion card by snapping into the second layer of the plurality of the double snap fit hooks using greater number of the plurality of the double snap fit hooks.

20 Claims, 5 Drawing Sheets

(56) References Cited

U.S. PATENT DOCUMENTS

| | | | | |
|---|---|---|---|---|
| 9,960,536 | B2 | 5/2018 | Motohashi | |
| 10,236,032 | B2 | 3/2019 | Kim | |
| 10,248,340 | B2 | 4/2019 | Ahn | |
| 10,417,162 | B2 | 9/2019 | Song | |
| 10,467,166 | B2 | 11/2019 | Breakstone | |
| 10,990,553 | B2 | 4/2021 | Rust | |
| 11,238,005 | B2 | 2/2022 | Olarig | |
| 11,520,381 | B2 | 12/2022 | Eliyahu | |
| 11,573,612 | B2 | 2/2023 | Liang | |
| 2007/0008703 | A1* | 1/2007 | Park .................... | H10W 40/641<br>165/80.4 |

* cited by examiner

INTERCHANGEABLE HEATSINK EXPANSION CARD HOLDER MODULE FOR AN INFORMATION HANDLING SYSTEM

FIELD OF THE DISCLOSURE

The present disclosure generally relates to expansion cards for an information handling system. More specifically, the present specification describes a heatsink expansion card holder module that may accommodate a plurality of types of SSD cards or other expansion cards for efficient use with motherboard space of an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. The information handling system may be used to execute instructions of one or more workspace productivity applications, gaming applications, or the like. Further, the information handling system may utilize one or more expansion cards that may be high performance for solid state memory devices or other devices operatively coupled to a motherboard of the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
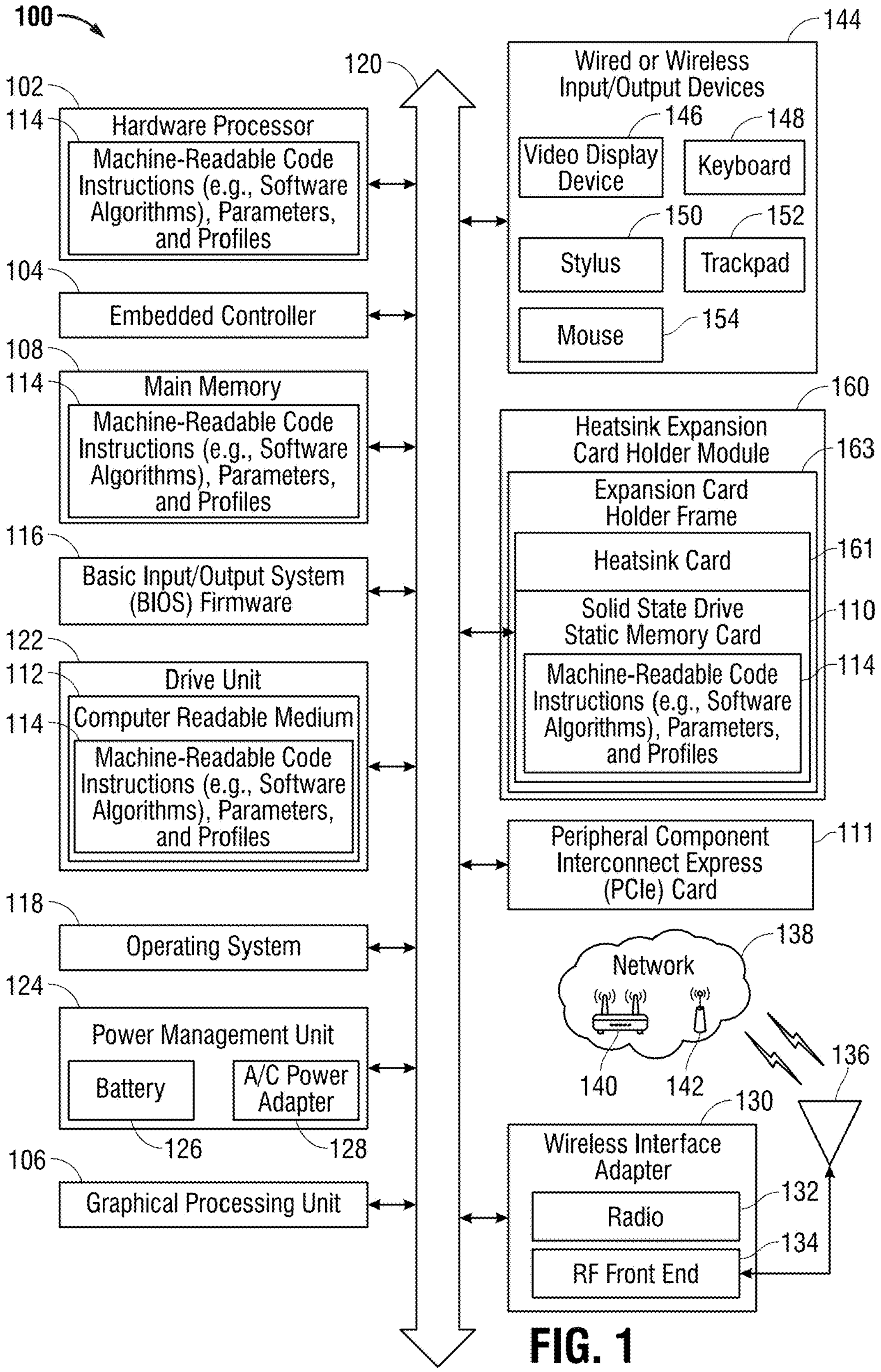
FIG. 1 is a block diagram illustrating an information handling system that may include expansion cards and a heatsink expansion card holder module to operatively couple to a motherboard of the information handling system according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems may include high-performance hardware components including central processing units (CPUs), graphic processing units (GPUs), microcontrollers, other hardware processors, radio frequency systems and wireless adapters, ports and network interface devices, memory or storage system, power management units, power transformers, battery systems, buses, and other components that are operatively coupled within the information handling system that allow a user to interact with the information handling system. Users may interact with the information handling system with one or more peripheral devices or to conduct various computing operations and execute computer readable executable code instructions of one or more software or firmware applications. Some of these high-performance hardware components may generate heat when operating and require cooling or thermal controls to prevent degradation of performance from overheating. Further, many of these high-performance hardware components are operatively coupled onto or near a motherboard printed circuit board (PCB), graphics boards, or other cards within the information handling system.

Due to a premium of space on these PCBs, especially a motherboard, one or more expansion cards may be used for some high-performance hardware components. An example expansion card may include a solid state drive (SSD) memory expansion card for a solid state memory drive device or a peripheral component interconnect express (PCIe) expansion card used with such high-performance hardware components. These expansion cards may be operatively coupled to a PCB, such as a motherboard PCB, via mounting with a mounting screw or nut and operatively coupled via data and power connectivity to the PCB in embodiments described herein as well as data and power coupling in some embodiments via a connector. Fewer contact mounting screw or nut holes required in the PCB to physically mount an expansion card holder will take less area on the PCB, such a motherboard PCB, which may be precious space in laying out traces and components on the PCB.

In embodiments of the present disclosure a card holder frame and a heatsink card are disclosed to form a heatsink expansion card holder module that may fit plural types of expansion cards of varying sizes to allow for different types of expansion cards to be used with the information handling system. The interchangeable heatsink expansion card holder may include a card holder frame with an array of double snap fit hooks arranged around the perimeter of the frame in embodiments herein which may be comprised of plastic or other suitable material. The card holder frame and array of double snap fit hooks may be formed and sized to meet standard width of one or more types of expansion cards that may be used with the heatsink expansion card holder module in an embodiment. An interchangeable heatsink card comprised of metal or other suitable heatsink material may fit in the card holder frame of the interchangeable heatsink expansion card holder module. The plastic card holder frame may be of a polygon shape, such as a generally rectangular shape, which is similar in at least one dimension to the plurality of expansion cards used with the heatsink expansion card holder module in embodiments herein. The heatsink card may include a set of fins on one side and a thermal on another side in various embodiments to provide for thermal conduction from any expansion card used with the heatsink expansion card holder module. The heatsink card may snap into a first level of the double snap bit hooks according to embodiments herein. In an embodiment, the metal heatsink card fits into the expansion card holder frame such that the fins extend through the plastic card holder frame of the interchangeable expansion card holder module to allow for heat venting.

The heatsink expansion card holder module allows for interchangeable expansion cards to be installed into a second level of the double snap fit hooks and thermally coupled to the heatsink card, such as via a thermal pad, depending on a specification of the information handling system in embodiments herein. For example, the heatsink expansion card holder module may be used with an SSD expansion card such as an M.2 expansion card for SSD memory that may have a standard width expansion card, but may accommodate two or more length M.2 cards. In a specific embodiment, either a 2230 series M.2 card or a 2280 series M.2 card may be used with the heatsink expansion card holder module for example. In other example, other plural types of expansion cards, such as PCIe cards of different dimensions, may be used with the embodiments of the present disclosure. With the heatsink expansion card holder module, including a metal mounting bracket with screw hole according to some embodiments and the double snap fit hooks for holding the interchangeable expansion cards, fewer mounting screws or nuts may be used to operatively couple the heatsink expansion card holder module with installed expansion card to the PCB, such as motherboard PCB, in the information handling system in embodiments herein.

Turning now to the figures, FIG. 1 illustrates an information handling system 100 similar to the information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP) 140, a base station transceiver 142, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a client computer in a server-client network environment, or as a peer computer system in a peer-to-peer (or distributed) network environment. In an embodiment, the information handling system 100 may be implemented using electronic devices that provide voice, video, or data communication. For example, an information handling system 100 may be any mobile or other computing device capable of executing a set of instructions (sequential or otherwise) that specify actions to be taken by that machine. Further, while a single information handling system 100 is illustrated, the term “system” shall also be taken to include any collection of systems or sub-systems that individually or jointly execute a set, or plural sets, of instructions to perform one or more computer functions. According to embodiments herein, information handling system 100 may be operatively coupled to one or more wired or wireless input/output (I/O) peripheral devices 144 to provide input to the information handling system 100 and receive output from the information handling system 100.

The information handling system 100 may include main memory 108, (volatile (e.g., random-access memory, etc.), or static memory 110, nonvolatile (read-only memory, flash memory etc.) or any combination thereof), one or more hardware processing resources, such as a hardware processor 102 that may be a central processing unit (CPU), embedded controller (EC) 104, a graphics processing unit (GPU) 106, or any combination thereof. Additional components of the information handling system 100 may include one or more storage devices such as drive unit 122 or static memory such as one or more types of SSD memory cards 110 as expansion cards according to various embodiments herein. The information handling system 100 may further include other types of expansion cards including, for example, PCIe cards 111, according to various embodiments herein. The information handling system 100 may include or interface with one or more communications ports for communicating with external devices, as well as various input and output (I/O) devices 144, such as a mouse 154, a trackpad 152, a stylus 150, a keyboard 148, a video/graphics display device 146, or other peripheral devices described herein, or any combination thereof. Portions of an information handling system 100 may themselves be considered information handling systems 100.

Information handling system 100 may include devices or modules that embody one or more of the devices or execute instructions for one or more systems and modules. The information handling system 100 may execute instructions (e.g., software algorithms), parameters, and profiles 114 that may operate on servers or systems, remote data centers, or on-box in individual client information handling systems according to various embodiments herein. In some embodiments, it is understood any or all portions of instructions (e.g., software algorithms), parameters, and profiles 114 may operate on a plurality of information handling systems 100.

The information handling system 100 may include the hardware processor 102 such as a central processing unit (CPU) or other hardware processing resources. Any of the hardware processing resources may operate to execute code that is either firmware or software code. Moreover, the information handling system 100 may include memory such as main memory 108, disk drive unit 122 or static memory such as SSD static memory card 110 (volatile (e.g., random-access memory, etc.), nonvolatile memory (read-only memory, flash memory etc.) or any combination thereof or other memory with computer readable medium 112 storing instructions (e.g., software algorithms or firmware), parameters, and profiles 114 executable by the hardware processor 102, EC 104, GPU 106, or any other hardware processing device. The information handling system 100 may also include one or more buses 120 operable to transmit communications between the various hardware components such as any combination of various I/O devices 144 as well as between hardware processors 102, an EC 104, the operating system (OS) 118, the basic input/output system (BIOS) 116, the wireless interface adapter 130, or a radio module, among other components described herein. In an embodiment, the hardware processor 102, EC 104, and/or GPU 106 may execute one or more bus drivers in order to transmit this data between the information handling system 100 and the input/output devices 144 described herein. In an embodiment, the information handling system 100 may be in wired or wireless communication with the I/O devices 144 such a keyboard 148, a mouse 154, video display device 146, stylus 150, trackpad 152, and other peripheral devices described herein.

As described herein, the information handling system 100 further includes a video/graphics display device 146. The video/graphics display device 146 in an embodiment may function as a liquid crystal display (LCD), an organic light emitting diode (OLED), a flat panel display, or a solid-state display. It is appreciated that the video/graphics display device 146 may be wired or wireless and may be an external video/graphics display device 146 that allows a user to increase the desktop area by extending the desktop in an embodiment. Additionally, as described herein, the information handling system 100 may include or be operatively coupled to a cursor control device (e.g., a trackpad 152, or gesture or touch screen input), a stylus 150, and/or a keyboard 148, among others that allows the user to interface with the information handling system 100 via the video/graphics display device 146. Information handling system 100 may also be operatively coupled to a wired or wireless input/output device 144 or other hardware devices via a docking station that may include a hardware processing device such as a hardware processor, microcontroller, or other hardware processing resource. Various drivers and hardware control device electronics may be operatively coupled to operate the I/O devices 144 according to the embodiments described herein. The present specification contemplates that the I/O devices 144 may be wired or wireless.

A network interface device of the information handling system 100 may be wired or wireless such as shown with wireless interface adapter 130 that can provide wireless connectivity among devices such as with Bluetooth® or to a network 138, e.g., a wide area network (WAN), a local area network (LAN), wireless local area network (WLAN), a wireless personal area network (WPAN), a wireless wide area network (WWAN), or other network. In embodiments described herein, the wireless interface adapter 130 with its radio 132, RF front end 134 and antenna 136 is used to communicate with the wireless peripheral devices including, in some embodiments, the wireless I/O peripheral devices, via, for example, a Bluetooth® or Bluetooth® Low Energy (BLE) protocols. In other embodiments, Bluetooth®, BLE or other WPAN or WLAN may be used for communication with and among one or more wireless I/O peripheral devices 144.

In other embodiments, a WAN, WWAN, LAN, and WLAN may each include an access point 140 or base station 142 used to operatively couple the information handling system 100 and docking station 156 to a network 138 via, for example, a wireless interface adapter 130. In a specific embodiment, the network 138 may include macro-cellular connections via one or more base stations 142 or a wireless access point 140 (e.g., Wi-Fi), or such as through licensed or unlicensed WWAN small cell base stations 142. Connectivity may be via wired or wireless connection. For example, wireless network wireless access points 140 or base stations 142 may be operatively connected to the docking station 156 and/or information handling system 100. Wireless interface adapter 130 may include one or more RF (RF) subsystems (e.g., radio 132) with transmitter/receiver circuitry, modem circuitry, one or more antenna RF (RF) front end circuits 134, one or more wireless controller circuits, amplifiers, antennas 136 and other circuitry of the radio 132 such as one or more antenna ports used for wireless communications via multiple radio access technologies (RATs). The radio 132 may communicate with one or more wireless technology protocols.

In an embodiment, the wireless interface adapter 130 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 130 may connect to any combination of macro-cellular wireless connections including 2G, 2.5G, 3G, 4G, 5G or the like from one or more service providers. Utilization of RF communication bands according to several example embodiments of the present disclosure may include bands used with the WLAN standards and WWAN carriers which may operate in both licensed and unlicensed spectrums. The wireless interface adapter 130 can represent an add-in card, wireless network interface module that is integrated with a main board of the information handling system 100 or integrated with another wireless network interface capability, or any combination thereof.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a hardware controller or a hardware processor system. Further, in an exemplary, non-limited embodiment, implementations may include distributed hardware processing, component/object distributed hardware processing, and parallel hardware processing. Alternatively, virtual computer system processing may be constructed to implement one or more of the methods or functionalities as described herein.

The present disclosure contemplates a computer-readable medium that includes computer-readable code instructions, parameters, and profiles 114 or receives and executes instructions, parameters, and profiles 114 responsive to a propagated signal, so that a hardware device connected to a network 138 may communicate voice, video, or data over the network 138. Further, the instructions 114 may be transmitted or received over the network 138 via the network interface device or wireless interface adapter 130.

The information handling system 100 may include a set of instructions 114 that may be executed to cause the computer system to perform any one or more of the methods or computer-based functions disclosed herein. For example, instructions 114 may be executed by a hardware processor 102, GPU 106, EC 104 or any other hardware processing resource and may include software agents, or other aspects or components used to execute the methods and systems described herein. Various software modules comprising application instructions 114 may be coordinated by an OS 118, and/or via an application programming interface (API) include a unified device API described herein. An example OS 118 may include Windows®, Android®, and other OS types. Example APIs may include Win 32, Core Java API, or Android APIs.

In an embodiment, the information handling system 100 may include a disk drive unit 122. The disk drive unit 122 and may include machine-readable code instructions, parameters, and profiles 114 in which one or more sets of machine-readable code instructions, parameters, and profiles 114 such as firmware or software can be embedded to be executed by the hardware processor 102 or other hardware processing devices such as a GPU 106 or EC 104, or other microcontroller unit to perform the processes described herein. Similarly, main memory 108 and static memory 110 may also contain a computer-readable medium for storage of one or more sets of machine-readable code instructions, parameters, or profiles 114 described herein. The disk drive unit 122 or static memory 110 also contain space for data storage. Further, the machine-readable code instructions, parameters, and profiles 114 may embody one or more of the methods as described herein. In a particular embodiment, the machine-readable code instructions, parameters, and profiles 114 may reside completely, or at least partially, within the main memory 108, the static memory of SSD static memory card 110, and/or within the disk drive 122 during execution by the hardware processor 102, EC 104, or GPU 106 of information handling system 100.

Main memory 108 or other memory of the embodiments described herein may contain computer-readable medium (not shown), such as RAM in an example embodiment. An example of main memory 108 includes random access memory (RAM) such as static RAM (SRAM), dynamic RAM (DRAM), non-volatile RAM (NV-RAM), or the like, read only memory (ROM), another type of memory, or a combination thereof. Static memory 110 may contain computer-readable medium (not shown), such as NOR or NAND flash memory in some example embodiments. The applications and associated APIs, for example, may be stored in static memory 110 or on the disk drive unit 122 that may include access to a machine-readable code instructions, parameters, and profiles 114 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 124 (a.k.a. a power supply unit (PSU)). The PMU 124 may include a hardware controller and executable machine-readable code instructions to manage the power provided to the components of the information handling system 100 such as the hardware processor 102 and other hardware components described herein. The PMU 124 may control power to one or more components including the one or more drive units 122, the hardware processor 102 (e.g., CPU), the EC 104, the GPU 106, a video/graphic display device 146, or other wired I/O devices 144 such as the mouse 154, the stylus 150, the keyboard 148, and the trackpad 152 and other components that may require power when a power button has been actuated by a user. In an embodiment, the PMU 124 may monitor power levels and be electrically coupled to the information handling system 100 to provide this power. The PMU 124 may be coupled to the bus 120 to provide or receive data or machine-readable code instructions. The PMU 124 may regulate power from a power source such as the battery 126 or AC power adapter 128. In an embodiment, the battery 126 may be charged via the AC power adapter 128 and provide power to the components of the information handling system 100, via wired connections as applicable, or when AC power from the AC power adapter 128 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium 112 can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

As described herein, the information handling system 100 may include a motherboard PCB, other PCBs, to operatively couple one or more hardware components of the information handling system 100 as discussed in embodiments herein. The motherboard PCB for example may include data and power traces as well as mountings for one or more hardware processors 102, 104, or 106, memory types 108, 110, or 112, wireless interface adapter 130 or other network interface device, and bus 120 in some embodiments. In other embodiments any of one or more hardware processors 102, 104, or 106, memory types 108, 110, or 112, wireless interface adapter 130 or other network interface device, as well as PMU 124, battery 126 or A/C power adapter 128 and any expansion cards such as SSD static memory card 110 or PCIe card 111 may be operatively coupled in whole or in parts to a motherboard PCB.

According to embodiments herein, an interchangeable heatsink expansion card holder module 160 is disclosed including an expansion card holder frame 163 and interchangeable expansion heatsink card 161 disclosed to form the heatsink expansion card holder module 160 that may fit plural types of expansion cards 110 or 111 of varying sizes to allow for different types of expansion cards to be used with the information handling system 100. The interchangeable expansion card holder module 160 may include an expansion card holder frame 163 with an array of double snap fit hooks arranged around the perimeter of the card holder frame 163 in embodiments herein. The card holder frame 163 with array of double snap fit hooks may be formed of plastic or other suitable material and sized to meet a standard width or other single dimension of one or more types of expansion cards 110 or 111 that may be used with the heatsink expansion card holder module 160 in an embodiment. The heatsink card 161 may fit in the expansion card holder frame 163 and may be of a generally rectangular shape and snap into a first level of the double snap bit hooks of the card holder frame 163 according to embodiments herein. In an embodiment, the heatsink card 161 fits into the expansion card holder frame 161 of the interchangeable expansion card holder 163 such that the fins of the heatsink card 161 extend through the card holder frame 161 of the interchangeable expansion card holder module 160 to allow for heat venting.

The heatsink expansion card holder module 160 allows for interchangeable expansion cards, such as various types of SSD static memory cards 110 or PCIe cards 111 of differing dimensions, to be installed into a second level of the double snap fit hooks and thermally coupled to the heatsink card 161. The thermal coupling of the interchangeable expansion card (e.g., 110 or 111) to the heatsink card 161 may be via a thermal pad in some embodiments herein. The choice of size or type of SSD static memory cards 110 or PCIe cards 111 used with the heatsink expansion card holder module 160 may depend on a specification called for of the information handling system being manufactured or upgraded (or downgraded) in embodiments herein. For example, the heatsink expansion card holder module 160 may be used with an SSD interchangeable expansion card such as SSD static memory card 110, such as an M.2 expansion card for SSD memory, which may have a standard width expansion card but differing lengths for types of expansion cards. The frame and double snap fit hooks of the interchangeable expansion card holder frame 163 for the heatsink expansion card holder module 160 may accommodate two or more lengths of M.2 cards in example embodiments. In a specific embodiment, either a 2230 series M.2 card or a 2280 series M.2 card may be used with the heatsink expansion card holder module 160 for example. In other examples, other plural types of expansion cards, such as PCIe cards 111 of different dimensions, may be used with the embodiments of the present disclosure. The heatsink expansion card holder module 160 and the double snap fit hooks of the card holder frame 163 for holding the interchangeable expansion cards (e.g., different types of expansion cards for SSD memory 110 or PCIe 111) allow for flexibility of custom specifications for different SSD static memory levels in manufacture or upgrade of information handling system 100. Further, the embodiments herein may provide for using fewer mounting screws or nuts to operatively couple the heatsink expansion card holder module with installed expansion card (e.g., 110 or 111) to the PCB, such as motherboard PCB, in the information handling system according to embodiments herein.

When referred to as a “system,” a “device,” a “module,” a “controller,” or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a standalone device). The system, device, controller, or module can include hardware processing resources executing software, including firmware embedded at a device, such as an Intel® brand processor, AMD® brand processors, Qualcomm® brand processors, or other processors and chipsets, or other such hardware device capable of operating a relevant software environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2:
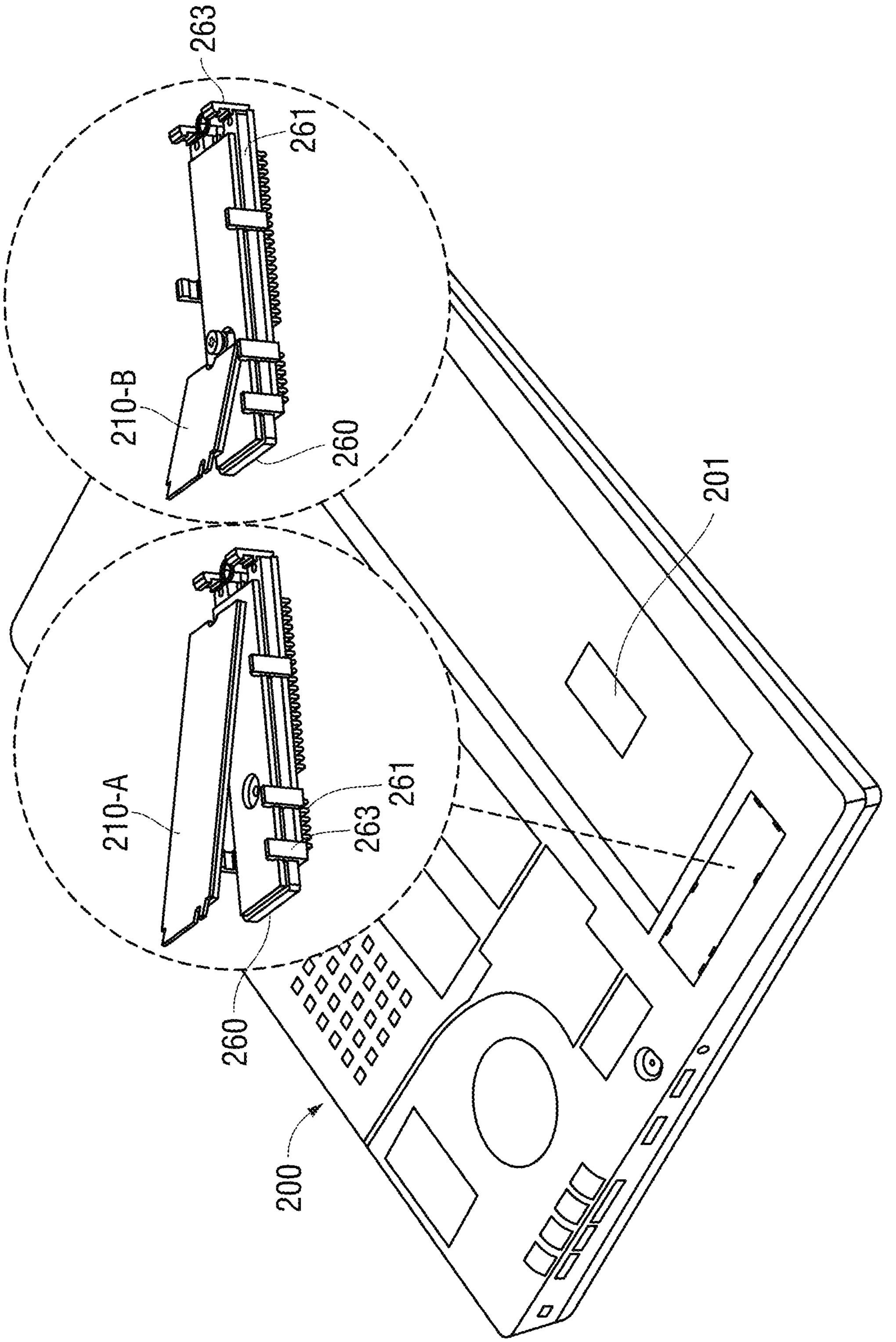
FIG. 2 is a graphic diagram illustrating an information handling system with a heatsink expansion card holder module and close up images of the heatsink expansion card holder module with two different sized expansion cards according to an embodiment of the present disclosure.

FIG. 2 is a perspective graphic diagram illustrating an information handling system that includes a heatsink expansion card holder module with a first type of expansion card or a second type of expansion card that may be operatively coupled to a motherboard printed circuit board (PCB) of the information handling system using the heatsink expansion card holder module according to embodiments of the present disclosure. The information handling system 200 shown in FIG. 2 may be a laptop information handling system as shown, or may be a desktop, all-in-one or other type of information handling system according to embodiments herein. The information handling system 200 includes a motherboard PCB 201 that may include a plurality of components described with respect to FIG. 1 including one or more hardware processors, memory devices, power sources, PMU, busses, power connection traces, as well as connectivity to one or more ports and internal components including one or more expansion cards such as a first type of expansion card 210-A or a second type of expansion card 210-B in embodiments herein. In particular embodiments, the first type of expansion card 210-A or the second type of expansion card 210-B may be expansion cards for solid state drive (SSD) memory storage such as type of M.2 SSD cards of varying sizes for use with the heatsink expansion card holder module 260 according to the present disclosure In other embodiments, varied types and sizes of expansion cards such as PCIe cards may be used with the heatsink expansion card holder module 260 of the present disclosure.

The heatsink expansion card holder module 260 for use with the information handling system 200 may include a plastic card holder frame 263 having a polygonal-shaped frame structure that is sized to fit the first type of expansion card 210-A or the second type of expansion card 210-B in a first dimension such as a width of those expansion cards but be also sized to accommodate differing lengths of the first type of expansion card 210-A or the second type of expansion card 210-B according to embodiments herein. The plastic card holder frame 263 of the heatsink expansion card holder module 260 may have a plurality of double snap fit hooks extending from a perimeter portion the polygonal-shaped frame structure in a first direction having sets of hooks that may be used to snap fit a metal heatsink card 261 used for thermal coupling with the expansion card. The metal heatsink card 261 may include a plurality of fins extending from a first side that may extend through a plurality of apertures or openings in the center of the plastic card holder frame 263 to the other side of the plastic card holder frame 263 for thermal venting.

The metal heatsink card 261 is operatively coupled to the plastic card holder frame 263 by snapping into a first layer of the plurality of double snap fit hooks of the plastic card holder frame 263 when the metal heatsink card 261 is slid into the plastic card holder frame 263 and fitted therein in embodiments herein. Further, the manufacturer, user, or an information technology decision maker (ITDM) may select among a plurality of expansion cards 210-A or 210-B or other to use with the heatsink expansion card holder module 260 for the information handling system 200 in embodiments herein. Either of the first or second type of expansion card 210-A or 210-B is slid into a second layer of hooks of the double snap fit hooks such that the metal heatsink card 261 and the first or second type of expansion card 210-A or 210-B are held to the plastic card holder frame 263 in embodiments herein. The heatsink expansion card holder module 260 operatively couples to a second type of expansion card 210-B that may be of a smaller size by snapping into a second layer of at least two of the plurality of the double snap fit hooks (three as shown) to thermally couple to the metal heat sink card 261 on a first side in an embodiment. The second type of expansion card 210-B that may be of a smaller size may be operatively coupled to the heatsink expansion card holder module 260 via a retention screw according to embodiments herein to further secure it. The heatsink expansion card holder module also may operatively couple to a first type of expansion card 210-A that may be of a larger size by snapping into the second layer of more of the plurality of the double snap fit hooks (all seven as shown) to thermally couple to the metal heat sink card 261 on a first side in another embodiment. In such a case, a retention screw may not be necessary according to embodiments herein but may be stored on the opposite side for later modifications.

With embodiments of the present disclosure, the manufacturer, user, or ITDM may utilize either of the first type of expansion card 210-A or a second type of expansion card 210-B with the heatsink expansion card holder module and may switch between the types of expansion cards depending on the capabilities desired. In particular embodiments, the first type of expansion card 210-A may be an M.2 SSD card of a 2280 standard size, which is a larger option, and the plastic card holder frame 263 and double snap fit hooks may be sized to fit the width and length of this first type of expansion card 210-A such that the double snap fit hooks hold the first type of expansion card 210-A to the heatsink expansion card holder module. Further, the plastic card holder frame 263 and some subset of the double snap fit hooks may accommodate the width of the second type of expansion card 210-B which may be an expansion cards for an M.2 SSD card of a 2230 standard size which is shorter but of similar width in embodiments. In such embodiments, a retaining screw may be used with the second, shorter type of expansion card. This retaining screw may be stored on the other side of the metal heatsink card 261 and plastic card holder frame 263 in other embodiments. It is appreciated that the heatsink expansion card holder module may be used with other plural types of expansion cards of varying sizes, such as PCIe cards or others, for use with the motherboard of the information handling system according to other embodiments of the present disclosure.

In embodiments herein, varied types and sizes of expansion cards may be operatively coupled to the motherboard PCB 201 using the heatsink expansion card holder module 260 of the present disclosure via one single attachment screw via an mounting bracket of the heatsink expansion card holder module 260 and thereby taking less space on the motherboard PCB 201 than expansion card systems using plural attachment screw receivers in the motherboard PCB 201. Further, the plural types of expansion cards 210-A and 210-B may be operatively coupled for data communications with the motherboard PCB and provided with power such that performance is improved and thermal mitigation provided for these various types of expansion cards 210-A and 210-B using the heatsink expansion card holder module 260 of embodiments herein.

Figure 3B:
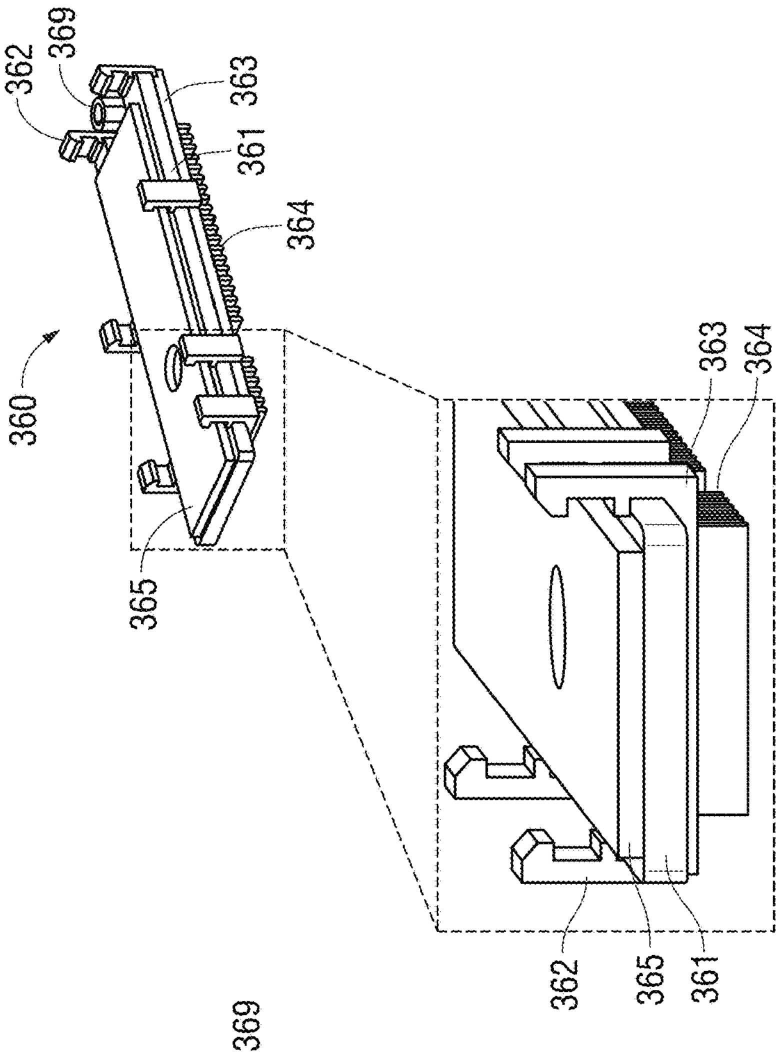
FIG. 3B is a graphic diagram perspective view of a formed heatsink expansion card holder module with a close up view according to an embodiment of the present disclosure.
Figure 3A:
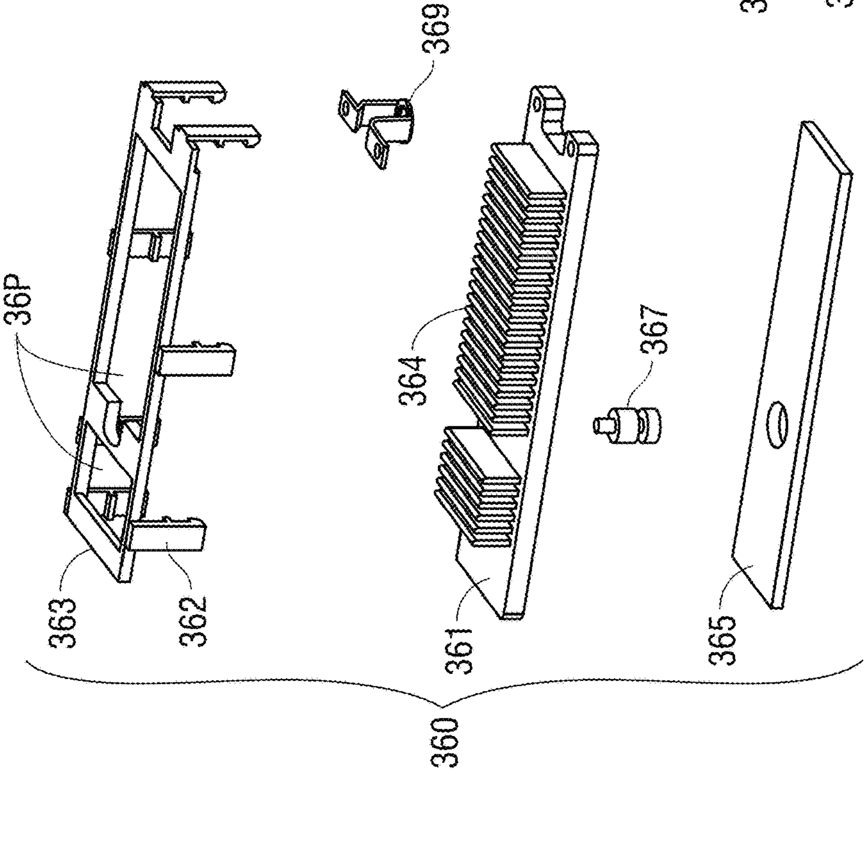
FIG. 3A is a graphic diagram illustrating an exploded image of a heatsink expansion card holder module according to an embodiment of the present disclosure.

FIG. 3A is a perspective exploded view graphic diagram illustrating a heatsink expansion card holder module without any expansion card according to embodiments of the present disclosure. FIG. 3B is an assembled view and close up view graphic diagram illustrating a heatsink expansion card holder module without any expansion card according to embodiments of the present disclosure. The heatsink expansion card holder module 360 shown in FIG. 3A and FIG. 3B may be used with a PCB motherboard (not shown) in an information handling according to embodiments herein. The information handling system and motherboard PCB may include a plurality of components described above with respect to FIG. 1 and may be operable with one or more expansion cards such as a first type of expansion card or a second type of expansion card depending on the selected configuration, adjustment, or upgrade required by an ITDM during the manufacture or use of the information handling system in embodiments herein. In particular embodiments, a first type of expansion card and a second type of expansion card may be expansion cards for solid state drive (SSD) memory storage such as type of M.2 SSD cards of varying sizes. These variable sized expansion cards may be used with the heatsink expansion card holder module 360 according to the present disclosure. In other embodiments, varied types and sizes of expansion cards such as PCIe cards may be used with the heatsink expansion card holder module 360 of the present disclosure.

The heatsink expansion card holder module 360 is shown in an exploded view in FIG. 3A and includes a plastic card holder frame 363 having a polygonal-shaped frame structure that is sized to fit plural expansion card types including at least the first type of expansion card or the second type of expansion card, in a first dimension such as a width of those expansion cards but be also sized to accommodate differing lengths of the various types of expansion cards according to embodiments herein. The plastic card holder frame 363 of the heatsink expansion card holder module 360 may have a plurality of double snap fit hooks 362 extending from a perimeter portion the polygonal-shaped frame structure in a first direction. In an example embodiment, each of the double snap fit hooks 362 has sets of hooks, or edges, on an inside surface of the double snap fit hooks 362 that may be used to snap fit a metal heatsink card 361 and an expansion card. The metal heatsink card 361 may include a plurality of fins 364 extending from a first side that may extend through a plurality of apertures or openings 368 in the center of the plastic card holder frame 363 to the other side of the plastic card holder frame 363 for thermal venting.

In an embodiment, the plastic card holder frame 363 is polygonal shaped and to be sized to accommodate a plurality of sizes or types of expansion cards. In the embodiment shown the plastic card holder frame 363 is rectangular. For example, the width dimension of the plastic card holder frame 363 may be wide enough between frame sides having double snap fit hooks to accommodate M.2 SSD cards of various sizes or lengths such as the 2230 or 2280 types that may snap fit in between the side double snap fit hooks in an embodiment. In other embodiments, the width dimension may accommodate plural expansion cards of a common width such as PCIe cards or other expansion cards. The length of the expansion cards may be variable and still fit within the plastic card holder frame 363 according to embodiments described herein. Similarly, the metal heatsink card 361 may be shaped to snap fit within the plastic card holder frame 363 and polygonal shaped similar to the plastic card holder frame 363 in embodiments herein.

The metal heatsink card 361 is operatively coupled to the plastic card holder frame 263 by snapping into a first layer of the plurality of double snap fit hooks of the plastic card holder frame 363 when the metal heatsink card 361 is slid into the plastic card holder frame 363 and fitted therein in embodiments herein. Further, the manufacturer, user, or an information technology decision maker (ITDM) may select among a plurality of expansion cards to use with the heatsink expansion card holder module 360 for the information handling system in embodiments herein. As described in embodiments herein, either of the first or second type of expansion card is slid into a second layer of hooks of the double snap fit hooks 362 such that the metal heatsink card 361 and the first or second type of expansion card are held to the plastic card holder frame 363 in embodiments herein. The heatsink expansion card holder module also may operatively couple to an expansion card that may be of a larger size by snapping into the second layer of hooks of more of the plurality of the double snap fit hooks 362 (all seven as shown) than a small expansion card does. Thus, this thermally couples to the metal heat sink card 361 on a first side to the expansion card that may be of a larger size in another embodiment.

The heatsink expansion card holder module 360 further includes a thermal pad layer 365 in some embodiments to thermally couple the metal heat sink card 361 on a first side to the expansion card to be installed. In embodiments herein, the thermal pad layer 365 may be polygonal shaped to form a thermal layer over the metal heat sink card 361. Thermal pad layer 365 may be made of a thermally conductive silicone or other suitable thermally conductive material to uniformly conduct heat from an expansion card to the metal heat sink card 361. The metal heat sink card 361 may be any thermally conductive metal such as aluminum, copper, or the like and may include thermal fin structures 364 on one side that may be opposite to the side with the thermal pad layer 365 in embodiments herein.

The plastic card holder frame 363 with some subset of the double snap fit hooks 362 may accommodate the width of the second type of expansion card which may be a shorter expansion card in embodiments herein. In such embodiments, a retaining screw 367 may be used with the second, shorter type of expansion card. This retaining screw 367 may include an outer edge to retain the shorter type of expansion card and may be received through a hole in the thermal pad layer 365 and into a threaded receiver hole or a receiver hole and a nut of the metal heat sink card 361. When a longer type of expansion card is used, the retaining screw 367 may be stored on the other side of the metal heatsink card 361 and plastic card holder frame 363 in other embodiments.

The heatsink expansion card holder module 360 may further include a metal mounting bracket 369 with a mounting screw hole that is used for mounting the assembled heatsink expansion card holder module 360 to a motherboard PCB of an information handling system with one screw in embodiments herein. The metal mounting bracket 369 may include side flanges that may be disposed and operatively coupled between the plastic card holder frame 363 and the metal heat sink layer card 361 such that it is affixed between those structures in embodiments herein. Then a single mounting screw may be used to operatively couple the heatsink expansion card holder module 360 through the screw hold of the metal mounting bracket 369 in embodiments herein. With this design aspect, a single mounting screw receiver location on the motherboard PCB is only needed to mount the heatsink expansion card holder module 360 and to have a cooled expansion card added. The metal mounting bracket 369 may further serve as a grounding bracket for the heatsink expansion card holder module 360 in embodiments herein. In this way, an expansion card may be added to a motherboard PCB with only one mounting screw in the motherboard PCB saving valuable motherboard PCB area for other purposes. It is understood that the expansion card used with the heatsink expansion card holder module 360 may be operatively coupled for data and power to the motherboard PCB via expansion card connectors as well, but the physical mounting of the heatsink expansion card holder module 360 to the motherboard PCB may be less obtrusively mounted using the metal mounting bracket described in embodiments of the heatsink expansion card holder module 360 herein.

It is appreciated that the heatsink expansion card holder module may be used with plural types of expansion cards of varying sizes, such as M.2 SSD cards, PCIe cards or others, for use with the motherboard of the information handling system according to other embodiments of the present disclosure. In embodiments herein, varied types and sizes of expansion cards may be operatively coupled to the motherboard PCB using the heatsink expansion card holder module 360 of the present disclosure via one single attachment screw thereby taking less space on the motherboard PCB. Further, the plural types of expansion cards may be operatively coupled for data communications with the motherboard PCB for improved performance along with thermal mitigation provided for these various types of expansion cards using the heatsink expansion card holder module 360 in embodiments of the present disclosure.

Figure 4A:
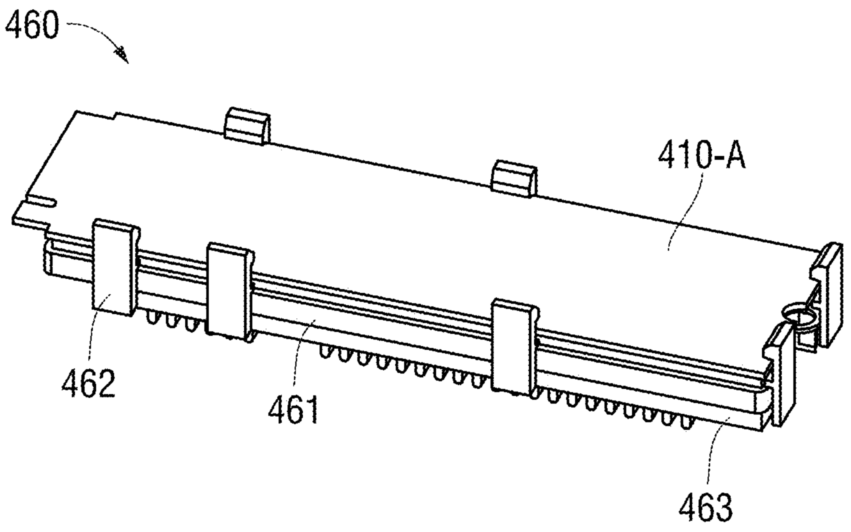
FIG. 4A is a is a graphic diagram illustrating an assembled heatsink expansion card holder module having a first expansion card type installed according to an embodiment of the present disclosure.
Figure 4B:
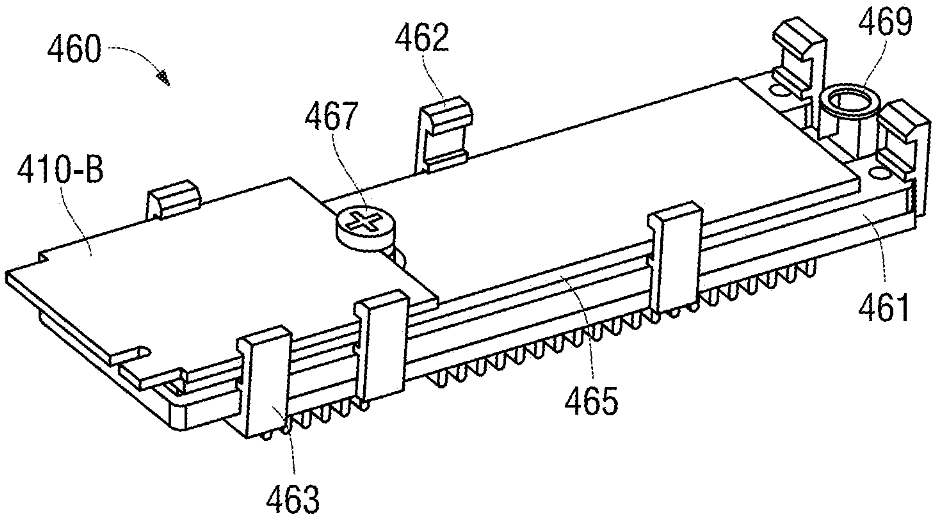
FIG. 4B is a is a graphic diagram illustrating an assembled heatsink expansion card holder module having a second expansion card type installed according to another embodiment of the present disclosure.

FIG. 4A is a perspective view graphic diagram illustrating a heatsink expansion card holder module assembled with a first type of expansion card according to embodiments of the present disclosure. FIG. 4B is a perspective view graphic diagram illustrating a heatsink expansion card holder module assembled with a second type of expansion card according to embodiments of the present disclosure. The heatsink expansion card holder module 460 shown in FIG. 4A and FIG. 4B may be used with a PCB motherboard (not shown) in an information handling according to embodiments herein. The information handling system and motherboard PCB may include a plurality of components described above with respect to FIG. 1 and may be operable with one or more expansion cards such as a first type of expansion card 410-A or a second type of expansion card 410-B depending on the selected configuration or adjustment or upgrade required by an ITDM during the manufacture or use of the information handling system in embodiments herein. In particular embodiments, a first type of expansion card 410-A and a second type of expansion card 410-B may be expansion cards for solid state drive (SSD) memory storage such as type of M.2 SSD cards of varying sizes. These variable sized expansion cards 410-A and 410-B may be used with the heatsink expansion card holder module 460 according to embodiments of the present disclosure. In other embodiments, varied types and sizes of expansion cards such as PCIe cards may be used with the heatsink expansion card holder module 460 of the present disclosure.

The heatsink expansion card holder module 460 is shown with a first type of expansion card 410-A in FIG. 4A and includes a plastic card holder frame 463 having a polygonal-shaped frame structure that is sized to fit plural expansion card types including at least the first type of expansion card 410-A or the second type of expansion card 410-B, in a first dimension such as a width of those expansion cards, but is also sized to accommodate differing lengths of the various types of expansion cards according to embodiments herein as shown in FIG. 4A and FIG. 4B. The plastic card holder frame 463 of the heatsink expansion card holder module 460 may have a plurality of double snap fit hooks 462 extending from a perimeter portion the polygonal-shaped frame structure in a first direction. In an example embodiment, each of the double snap fit hooks 462 has sets of hooks on an inside surface of the double snap fit hooks 462 that may be used to snap fit a metal heatsink card 461 and an expansion card, such as either 410-A or 410-B. The metal heatsink card 461 may include a plurality of fins extending from a first side that may extend through a plurality of apertures or openings in the center of the plastic card holder frame 463 to the other side of the plastic card holder frame 463 for thermal venting.

In an embodiment, the plastic card holder frame 463 has a polygonal shaped, in the embodiment shown it is rectangular, and the plastic card holder frame 463 is sized to accommodate a plurality of sizes or types of expansion cards in at least one dimension for snap fit operative coupling. For example, the width dimension of the plastic card holder frame 463 may be wide enough between side double snap fit hooks to accommodate plural expansion cards 410-A and 410-B of various sizes and lengths as shown in embodiments in FIG. 4A and FIG. 4B. For example, the first and second expansion cards 410-A and 410-B may be M.2 SSD cards of various sizes or lengths such as the 2230 or 2280 types that may snap fit in between the side double snap fit hooks 462 in an embodiment. In other embodiments, the width dimension may accommodate plural expansion cards of a common width such as PCIe cards or other expansion cards. The length of the expansion cards may be variable and still fit within the plastic card holder frame 463 according to embodiments described herein. Similarly, the metal heatsink card 461 may be shaped to snap fit within the plastic card holder frame 463 and polygonal shaped similar to the plastic card holder frame 463 in embodiments herein.

The metal heatsink card 461 is operatively coupled to the plastic card holder frame 463 by snapping into a first layer of the plurality of double snap fit hooks of the plastic card holder frame 463. Further, the manufacturer, user, or an information technology decision maker (ITDM) may select among a plurality of expansion cards to use with the heatsink expansion card holder module 460 for the information handling system in embodiments herein. As described in embodiments herein, either of the first or second type of expansion card 410-A or 410-B is slid into a second layer of hooks of the double snap fit hooks 462 such that the metal heatsink card 461 and the first or second type of expansion card is held to the plastic card holder frame 463 in embodiments herein. The heatsink expansion card holder module 460 may operatively couple to an expansion card that may be of a larger size such as 410-A by snapping into the second layer of more of the plurality of the double snap fit hooks 462 (all seven as shown) than a smaller expansion card 410-B does. In this way, the larger sized expansion card 410-A is thermally coupled to the metal heat sink card 461 on a first side within the heatsink expansion card holder module 460 in the embodiment of FIG. 4A.

The plastic card holder frame 463 may accommodate a smaller expansion card 410-B using some subset of the double snap fit hooks 462 may accommodate the width of the second type of expansion card 410-B which may be a shorter expansion card in embodiments herein. In such embodiments, a retaining screw 467 may be used with the second, shorter type of expansion card 410-B to operatively couple it to the heatsink expansion card holder module 460. This retaining screw 467 may include an outer edge to retain the shorter type of expansion card 410-B and may be received through a hole in a thermal pad layer 465 and into a threaded receiver hole or a receiver hole with a nut in the metal heat sink card 461 in embodiments herein. When a longer type of expansion card 410-A is used as with FIG. 4A, the retaining screw 467 may be stored on the other side of the metal heatsink card 461 and plastic card holder frame 463 in other embodiments.

The heatsink expansion card holder module 460 further includes a thermal pad layer 465 in some embodiments to thermally couple the metal heat sink card 461 on a first side to the expansion card to be installed. In embodiments herein, the thermal pad layer 465 may be polygonal shaped to form a thermal layer over the metal heat sink card 461. Thermal pad layer 465 may be made of a thermally conductive silicone to uniformly conduct heat from an expansion card to the metal heat sink card 461. The metal heat sink card 461 may be any thermally conductive metal such as aluminum, copper, or the like and may include thermal fin structures on one side that may be opposite to the side with the thermal pad layer 465 in embodiments herein.

The heatsink expansion card holder module 460 may further include a metal mounting bracket 469 with a mounting screw hole that is used for mounting the assembled heatsink expansion card holder module 460 to a motherboard PCB of an information handling system with one screw in embodiments herein. With this design aspect, a single mounting screw receiver location on the motherboard PCB is only needed to mount the heatsink expansion card holder module 460 and the metal mounting bracket 469 may further serve as a grounding bracket for the heatsink expansion card holder module 460 in embodiments herein. In this way, an expansion card may be added a motherboard PCB with only one mounting screw in the motherboard PCB saving valuable motherboard PCB area for other purposes. It is understood that the expansion card used with the heatsink expansion card holder module 460 may be operatively coupled for data and power to the motherboard PCB via expansion card connectors as well, but the physical mounting of the heatsink expansion card holder module 460 to the motherboard PCB may be less obtrusively mounted using the metal mounting bracket described in embodiments of the heatsink expansion card holder module 460 herein.

It is appreciated that the heatsink expansion card holder module may be used with plural types of expansion cards of varying sizes, such as M.2 SSD cards, PCIe cards or others, for use with the motherboard of the information handling system according to other embodiments of the present disclosure. In embodiments herein, varied types and sizes of expansion cards may be operatively coupled to the motherboard PCB using the heatsink expansion card holder module 460 of the present disclosure via one single attachment screw thereby taking less space on the motherboard PCB. Further, the plural types of expansion cards may be operatively coupled for data communications with the motherboard PCB for improved performance with thermal mitigation provided for these various types of expansion cards using the heatsink expansion card holder module 460 in embodiments of the present disclosure.

Figure 5:
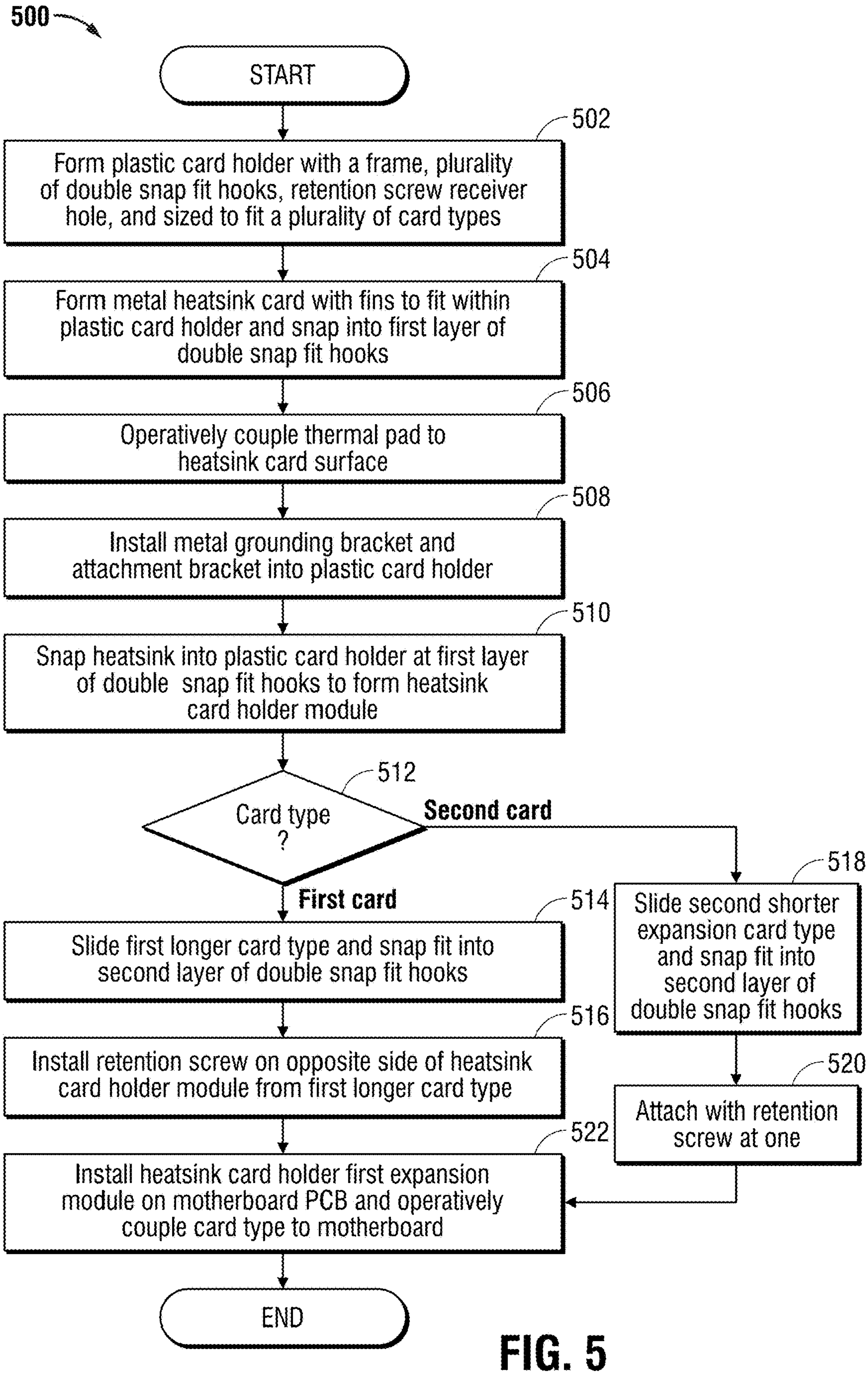
FIG. 5 is a flowchart showing a method assembling a heatsink expansion card holder module with an expansion card according to an embodiment of the present disclosure.

FIG. 5 is a flowchart showing a method 500 of assembling a heatsink expansion card holder module for use with an expansion card selected from a plurality of expansion card types for operative coupling with a motherboard PCB of an information handling system according to an embodiment of the present disclosure. In an embodiment, the method 500 may be conducted at manufacture of an information handling system by a manufacturer to meet a request technical specification for an information handling system or by an ITDM adjusting, repairing, upgrading or otherwise changing an expansion card used with an information handling system according to embodiments herein. As described in embodiments of the present disclosure, the heatsink expansion card holder module assembled and installed in an information handling system according to embodiments herein may accommodate plural sizes and models of expansion cards for use with an motherboard PCB with limited footprint impact on the motherboard PCB upon mounting.

At block 502, the method 500 may include forming a heatsink expansion card holder module includes forming a plastic card holder frame having a polygonal-shaped frame structure that is sized to fit plural expansion card types including at least a first type of expansion card or a second type of expansion card in an embodiment. The plastic card holder frame may be formed via injection molding in an example embodiment, and may include a first dimension such as a width that corresponds to accommodate the width of those plurality of expansion cards that may be used with the plastic card holder frame. Further, the plastic card holder frame may also be sized to accommodate differing lengths of the various types of expansion cards that will be used with the heatsink expansion card holder module according to embodiments herein and as shown in FIG. 4A and FIG. 4B above. The plastic card holder frame of the heatsink expansion card holder module may further be formed with a plurality of double snap fit hooks extending from a perimeter portion the polygonal-shaped frame structure in a first direction. In an example embodiment, each of the double snap fit hooks has sets of hooks, or edges, on an inside surface of the double snap fit hooks. These hooks of the double snap fit hook structures of the plastic card holder frame may be used to snap fit a metal heatsink card and an expansion card, such as either a first or second sized expansion card. The plastic card holder frame may include an outer perimeter that surrounds and forms one or more apertures which may accommodate fins of a metal heatsink card as described below. The plastic card holder frame may also include one or more cross supports across the apertures that may include a receiving hold for any receiver screw that may be used in embodiments herein.

In an embodiment described with respect to FIG. 4, the plastic card holder frame 463 is polygonal shaped, in the embodiment shown rectangular, to be sized to accommodate a plurality of sizes or types of expansion cards. For example, the width dimension of the plastic card holder frame 463 may be wide enough between side double snap fit hooks to accommodate plural expansion cards 410-A and 410-B of various sizes and lengths as shown in embodiments in FIG. 4A and FIG. 4B. For example, the first and second expansion cards 410-A and 410-B may be M.2 SSD cards of various sizes or lengths such as the 2230 or 2280 types that may snap fit in between the side double snap fit hooks 462 in an embodiment. In other embodiments, the width dimension may accommodate plural expansion cards of a common width such as PCIe cards or other expansion cards. The length of the expansion cards may be variable and still fit within the plastic card holder frame 463 according to embodiments described herein.

At block 504, a metal heatsink card is formed and may include a plurality of fins extending from a first side that may extend through a plurality of apertures or openings in the center of the plastic card holder frame to the other side of the plastic card holder frame for thermal venting. The metal heatsink card may be formed from aluminum, copper, or other thermally conductive metal in example embodiments. Further the metal heatsink card may be shaped to snap fit within the plastic card holder frame and polygonal-shaped similar to the plastic card holder frame in embodiments herein. The metal heatsink card will be operatively coupled to the plastic card holder frame by snapping into a first layer of the plurality of double snap fit hooks of the plastic card holder frame as described below at block 510.

At block 506, a thermal pad layer in some embodiments is formed on a first side of the metal heat sink card to thermally couple the metal heat sink card on a first side to the expansion card to be installed. In embodiments herein, the thermal pad layer may be polygonal shaped to form a thermal layer over the metal heat sink card. A thermal pad layer may be formed of a thermally conductive silicone to uniformly conduct heat from an expansion card to the metal heat sink card. The thermal pad layer may be any thermally conductive material for forming a uniform contact between metal heat sink card and the expansion card to be installed in embodiments herein.

At block 508, the heatsink expansion card holder module in embodiments is formed with installation of a metal mounting bracket with a mounting screw hole that is used for mounting the assembled heatsink expansion card holder module to a motherboard PCB of an information handling system with one screw. The metal mounting bracket may be formed of pressed sheet metal or by any other method. The metal mounting bracket may include side flanges on either side of the mounting screw hole that are of a width to fit between the plastic card holder frame and metal heat sink layer card of the heatsink expansion card holder module. Thus, the metal mounting bracket may be disposed and operatively coupled between the plastic card holder frame and the metal heat sink layer card such that it is affixed between those structures in embodiments herein. With this metal mounting bracket, a single mounting screw receiver location on the motherboard PCB is only needed to mount the heatsink expansion card holder module and the metal mounting bracket may further serve as a grounding bracket for the heatsink expansion card holder module in embodiments herein. In this way, an expansion card may be added a motherboard PCB with only one mounting screw in the motherboard PCB saving valuable motherboard PCB area for other purposes.

At block 510, the metal heatsink card will be operatively coupled to the plastic card holder frame by snapping into a first layer of the plurality of double snap fit hooks of the plastic card holder frame in an embodiment. The metal heatsink card will hold the metal mounting bracket flanges to the plastic card holder frame such that the screw hole of the metal mounting bracket will provide for an attachment point of the heatsink expansion card holder module to the motherboard PCB in the information handling system. Further, the fins of the metal heatsink card are disposed through the apertures of the plastic card holder frame to the other side to provide for venting of the fins in an embodiment. An opposite side of the metal heatsink card with a thermal pad faces a direction of the second layer of hooks of the double snap fit hooks for receiving one of a selection of plural expansion card types.

At block 512, the manufacturer, user, or an information technology decision maker (ITDM) may select among a plurality of expansion cards to use with the heatsink expansion card holder module for the information handling system in embodiments herein. As described in embodiments herein including FIG. 4A and FIG. 4B, either of the first or second type of expansion card 410-A or 410-B is slid into a second layer of hooks of the double snap fit hooks 462 such that the metal heatsink card 461 and the first or second type of expansion card are held to the plastic card holder frame 463 in embodiments herein.

If at block 512, a first expansion card type is selected that is a larger or longer expansion card type, at block 514 the heatsink expansion card holder module is operatively coupled to an expansion card that may be of a larger size such as 410-A of FIG. 4A by sliding the card in and snapping it into the second layer of more of the plurality of the double snap fit hooks 462 (all seven as shown) than a smaller expansion card 410-B does, to thermally couple to the metal heat sink card 461 on a first side. At block 516, when the longer, first type of expansion card, such as 410-A of FIG. 4A, is used the retaining screw 467 may be stored on the other side of the metal heatsink card 461 and plastic card holder frame 463 in an embodiment.

Flow then proceeds to block 522 where the heatsink expansion card holder module is installed on a motherboard PCB of an information handling system, if not already installed. A single screw in some example embodiments may be used to mount and ground the assembled heatsink expansion card holder module to the motherboard PCB. Further, any data, power and communication connections with the PCB motherboard or other components of the information handling system may be operatively coupled through a card connector port such as at any portion of the expansion card used with the heatsink expansion card holder module.

Returning to block 512, when a smaller, second expansion card is used, flow may proceed to block 518. At block 518, the plastic card holder frame 463 may accommodate a smaller expansion card 410-B using some subset of the double snap fit hooks 462 as shown in the example embodiment of FIG. 4B. The plastic card holder frame 463 may accommodate the width of the second type of expansion card 410-B which may be a shorter expansion card in embodiments herein. At block 520, a retaining screw 467 may be used with the second, shorter type of expansion card 410-B to operatively couple it to the heatsink expansion card holder module 460. This retaining screw 467 may include an outer edge to retain the shorter type of expansion card 410-B and may be received through a hole in a thermal pad layer 465 and into a threaded receiver hole or a receiver hole and a nut of the metal heat sink card 461 in embodiments herein.

Flow then proceeds to block 522 where the heatsink expansion card holder module is installed on a motherboard PCB of an information handling system, if not already installed. A single screw in some example embodiments may be used to mount and ground the assembled heatsink expansion card holder module to the motherboard PCB. Further, any data, power and communication connections with the PCB motherboard or other components of the information handling system may be operatively coupled through a card connector port such as at any portion of the expansion card used with the heatsink expansion card holder module.

It is appreciated that the heatsink expansion card holder module may be used with plural types of expansion cards of varying sizes, such as M.2 SSD cards, PCIe cards or others, for use with the motherboard of the information handling system according to other embodiments of the present disclosure. In embodiments herein, varied types and sizes of expansion cards may be operatively coupled to the motherboard PCB using the heatsink expansion card holder module of the present disclosure via one single attachment screw thereby taking less space on the motherboard PCB. Further, the plural types of expansion cards may be operatively coupled for data communications with the motherboard PCB and performance and thermal mitigation provided for these various types of expansion cards using the heatsink expansion card holder module in embodiments of the present disclosure.

The blocks of the flow diagram of FIG. 5, or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A heatsink expansion card holder module for use with an information handling system comprising:

a plastic card holder frame including a polygonal-shaped frame structure including a plurality of apertures in the center of the plastic card holder frame and a plurality of double snap fit hooks extending from a perimeter portion of the polygonal-shaped frame structure in a first direction; and a metal heatsink card operatively coupled to the plastic card holder frame to snap in to a first layer of the plurality of double snap fit hooks such that the metal heatsink card is held to the plastic card holder frame, wherein the heatsink expansion card holder module operatively couples to a first type of expansion card by snapping into a second layer of at least two of the plurality of the double snap fit hooks to thermally couple to the metal heat sink card on a first side; and the heatsink expansion card holder module mounting to a motherboard of an information handling system via a motherboard retention screw.

2. The heatsink expansion card holder module of claim 1 further comprising:

the metal heatsink card having a plurality of fins extending from a second side of the metal heatsink card to extend through the plurality of apertures in the center of the plastic card holder frame in a second direction when operatively coupled to the plastic card holder frame.

3. The heatsink expansion card holder module of claim 1, wherein the plastic card holder frame operatively couples to a second type of expansion card instead of a first type of expansion card by snapping into the second layer of the plurality of the double snap fit hooks to thermally couple to the metal heat sink card, where the second type of expansion card has a different length than the first type of expansion card.

4. The heatsink expansion card holder module of claim 1, wherein the plastic card holder frame operatively couples to a second type of expansion card instead of a first type of expansion card by snapping into the second layer of a greater number of the plurality of the double snap fit hooks than are used for the first type of expansion card to thermally couple to the metal heat sink card.

5. The heatsink expansion card holder module of claim 1 further comprising:

a thermal pad operatively coupled to the first side of the metal heat sink card to thermally couple the metal heat sink card to the first type of expansion card.

6. The heatsink expansion card holder module of claim 1 further comprising:

a retention screw receiver in the metal heat sink card to operatively couple the first side of the metal heat sink card to the first type of expansion card via a heatsink expansion card holder retention screw.

7. The heatsink expansion card holder module of claim 1, wherein the first type of expansion card is an M.2 solid state drive expansion card that is a 2230 series M.2 card.

8. The heatsink expansion card holder module of claim 3, wherein the second type of expansion card is an M.2 solid state drive expansion card that is a 2280 series M.2 card.

9. A heatsink expansion card holder module for use with a motherboard of an information handling system comprising:

a plastic card holder frame including a polygonal-shaped frame structure including a plurality of apertures in the center of the plastic card holder frame and a plurality of double snap fit hooks extending from a perimeter portion of the polygonal-shaped frame structure;

a metal heatsink card operatively coupled to the plastic card holder frame to snap in to a first layer of the plurality of double snap fit hooks such that the metal heatsink card is held to the plastic card holder frame;

the heatsink expansion card holder module sized to fit a first type of expansion card by snapping into a second layer of at least two of the plurality of the double snap fit hooks to thermally couple to the metal heat sink card on a first side;

the heatsink expansion card holder module sized to fit a second type of expansion card by snapping into the second layer of the plurality of the double snap fit hooks that is greater than the number of the plurality of the double snap fit hooks used to hold the first type of expansion card to thermally couple the second type of expansion card to the metal heat sink card on the first side;

the first type of expansion card or the second type of expansion card operatively coupled to the heatsink expansion card holder module; and the heatsink expansion card holder module mounted to a motherboard of an information handling system via a retention screw.

10. The heatsink expansion card holder module of claim 9 further comprising:

the metal heatsink card having a plurality of fins extending from a second side to extend through the plurality of apertures in the center of the plastic card holder frame when operatively coupled to the plastic card holder frame.

11. The heatsink expansion card holder module of claim 9 further comprising:

a thermal pad operatively coupled to the first side of the metal heat sink card to thermally couple the metal heat sink card to the first type of expansion card or the second type of expansion card.

12. The heatsink expansion card holder module of claim 9 further comprising:

a heatsink expansion card holder retention screw receiver in the metal heat sink card to operatively couple the first side of the metal heat sink card to the first type of expansion card via a heatsink expansion card holder retention screw.

13. The heatsink expansion card holder module of claim 9 further comprising:

a heatsink expansion card holder retention screw receiver in the metal heat sink card to receive a heatsink expansion card holder retention screw on the second side when a second type of expansion card is operatively coupled to the heatsink expansion card holder module.

14. The heatsink expansion card holder module of claim 9, wherein the first type of expansion card is an M.2 solid state drive expansion card that is a 2230 series M.2 card.

15. The heatsink expansion card holder module of claim 9, wherein the second type of expansion card is an M.2 solid state drive expansion card that is a 2280 series M.2 card.

16. The heatsink expansion card holder module of claim 9, wherein the first type of expansion card is a peripheral component interconnect express (PCIe) expansion card of a first size and the second type of expansion card is a PCIe expansion card of a second size smaller than the first size.

17. An information handling system with a heatsink expansion card holder module comprising:

a motherboard printed circuit board (PCB) having a hardware processor, a memory, a power source, and data busses and power traces;

a heatsink expansion card holder module having a plastic card holder frame including a polygonal-shaped frame structure including a plurality of apertures in the center of the plastic card holder frame and a plurality of double snap fit hooks extending from a perimeter portion of the polygonal-shaped frame structure;

a metal heatsink card operatively coupled to the plastic card holder frame of the heatsink expansion card holder module to snap in to a first layer of the plurality of double snap fit hooks such that the metal heatsink card is held to the plastic card holder frame;

the heatsink expansion card holder module sized to fit a first type of expansion card by snapping into a second layer of at least two of the plurality of the double snap fit hooks to thermally couple to the metal heat sink card on a first side;

the heatsink expansion card holder module sized to fit a second type of expansion card by snapping into the second layer of the plurality of the double snap fit hooks greater than the number of the plurality of the double snap fit hooks used to hold the first type of expansion card to thermally couple the second type of expansion card to the metal heat sink card on the first side;

the first type of expansion card or the second type of expansion card operatively coupled to the heatsink expansion card holder module; and the heatsink expansion card holder module operatively coupled to the motherboard PCB of the information handling system.

18. The information handling system of claim 17 further comprising:

the metal heatsink card having a plurality of fins extending from a second side to extend through the plurality of apertures in the center of the plastic card holder frame when operatively coupled to the plastic card holder frame.

19. The information handling system of claim 17, wherein the first type of expansion card is an M.2 solid state drive expansion card that is a 2230 series M.2 card and the second type of expansion card is an M.2 solid state drive expansion card that is a 2280 series M.2 card.

20. The information handling system of claim 17 further comprising:

a thermal pad operatively coupled to the first side of the metal heat sink card to thermally couple the metal heat sink card to the first type of expansion card or the second type of expansion card.

* * * * *